(12) United States Patent
Huang et al.

(10) Patent No.: US 12,051,609 B2
(45) Date of Patent: Jul. 30, 2024

(54) SYSTEMS AND METHODS FOR HUMIDITY CONTROL OF FOUP DURING SEMICONDUCTOR FABRICATION

(71) Applicant: Taiwan Semiconductor Manufacturing Company, Hsinchu (TW)

(72) Inventors: Sung-Ju Huang, Taipei (TW); Kuang-Wei Cheng, Hsinchu (TW); Cheng-Lung Wu, Zhunan (TW); Yi-Fam Shiu, Toufen (TW); Chyi-Tsong Ni, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 93 days.

(21) Appl. No.: 17/687,844

(22) Filed: Mar. 7, 2022

(65) Prior Publication Data

US 2023/0154778 A1  May 18, 2023

Related U.S. Application Data

(60) Provisional application No. 63/279,870, filed on Nov. 16, 2021.

(51) Int. Cl.
*H01L 21/677* (2006.01)
*H01L 21/673* (2006.01)

(52) U.S. Cl.
CPC .. *H01L 21/67742* (2013.01); *H01L 21/67389* (2013.01); *H01L 21/67766* (2013.01)

(58) Field of Classification Search
CPC ......... H01L 21/67775; H01L 21/67778; H01L 21/67389; H01L 21/67393; H01L 21/67196; H01L 21/67772; B61D 27/00; B61D 27/009; E06B 7/26; F24F 13/08; F24F 13/082; F24F 3/163; F24F 3/167;
(Continued)

(56) References Cited

U.S. PATENT DOCUMENTS 6,626,971 B1 * 9/2003 Forbert ............... F24F 9/00
55/385.2
2003/0031537 A1 * 2/2003 Tokunaga ......... H01L 21/67772
414/217
(Continued)

FOREIGN PATENT DOCUMENTS

EP 3311402 B1 12/2020

OTHER PUBLICATIONS

Taiwan Office Action for Application No. 11221251690 Dated Dec. 13, 2023.

*Primary Examiner* — Glenn F Myers
(74) *Attorney, Agent, or Firm* — Lippes Mathias LLP

(57) ABSTRACT

The present disclosure relates to systems and methods for reducing the humidity within a FOUP (Front Opening Unified Pod) when loaded on an EFEM (Equipment Front End Module) for transfer of a semiconductor wafer substrate during fabrication processes. A deflector of specified structure is placed inside the EFEM above the load port of the FOUP. The deflector directs airflow in the EFEM away from the load port. The deflector includes a body with a plurality of apertures in the deflector body, and with a sloped front surface. Thus, the degree of penetration of high-humidity air from the EFEM into the FOUP is reduced.

20 Claims, 12 Drawing Sheets

(58) Field of Classification Search
CPC ........ F24F 3/10; F24F 7/10; F24F 9/00; F24F 2009/007; F24F 2013/0608; F24F 2013/088
USPC .......................... 454/57, 192, 226, 209, 155
See application file for complete search history.

(56) References Cited

U.S. PATENT DOCUMENTS

| | | | |
|---|---|---|---|
| 2009/0035100 A1* | 2/2009 | Okabe ............... | H01L 21/67772 414/217 |
| 2014/0157722 A1* | 6/2014 | Iwamoto ........... | H01L 21/67775 53/111 R |
| 2015/0024671 A1* | 1/2015 | Taniyama ......... | H01L 21/67772 454/193 |
| 2018/0174875 A1* | 6/2018 | Kim .................. | H01L 21/67393 |
| 2021/0280446 A1 | 9/2021 | Fuller et al. | |

* cited by examiner

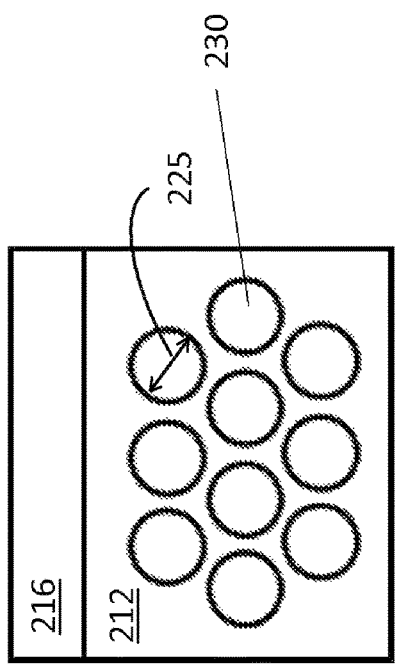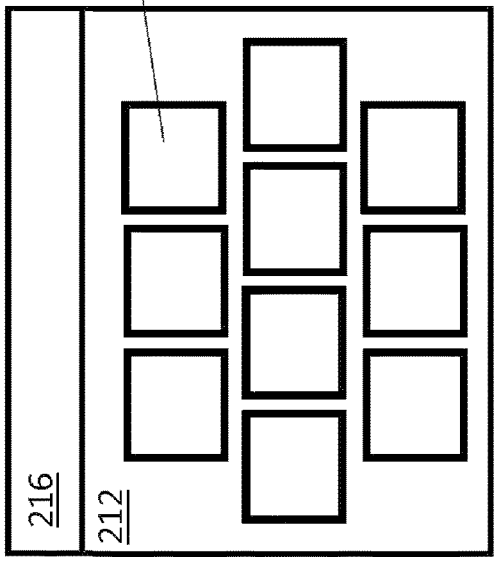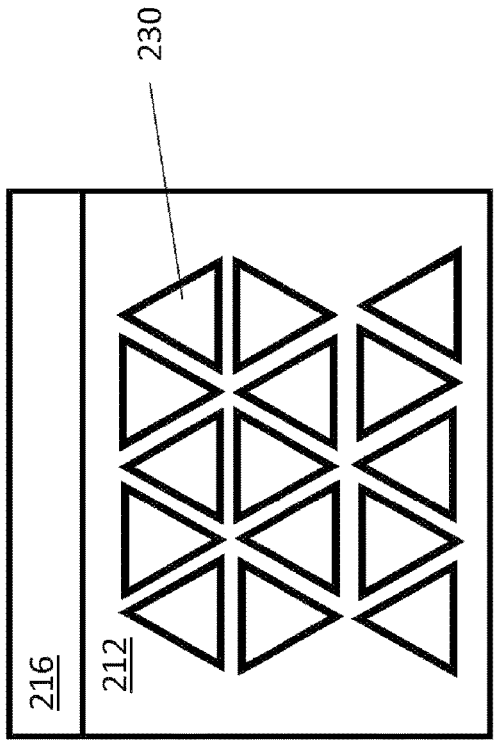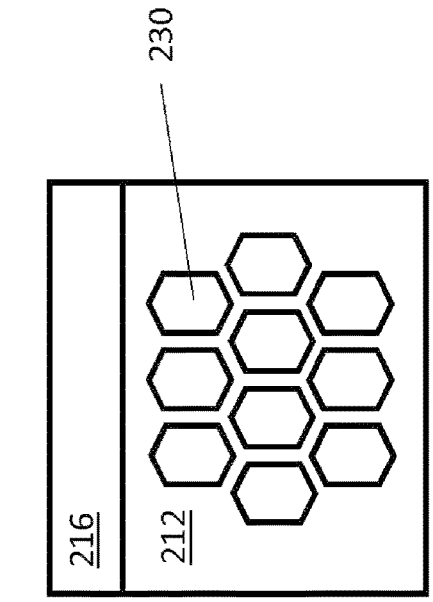

SYSTEMS AND METHODS FOR HUMIDITY CONTROL OF FOUP DURING SEMICONDUCTOR FABRICATION

PRIORITY CLAIM AND CROSS-REFERENCE

This application claims priority to U.S. Provisional Patent Application Ser. No. 63/279,870, filed on Nov. 16, 2021, which is incorporated by reference in its entirety.

BACKGROUND

Semiconductor integrated circuits may be produced by a plurality of processes such as thermal oxidation, diffusion, ion implantation, RTP (rapid thermal processing), CVD (chemical vapor deposition), PVD (physical vapor deposition), etching, and photolithography. Semiconductor wafer substrates are placed in a FOUP (Front Opening Unified Pod) for storage between process steps and for transportation between various processing machines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A shows a first embodiment where the EFEM has two load ports and two separate deflectors, one for each load port.

FIG. 6B shows a second embodiment where the EFEM has two load ports and one deflector which spans the width of both load ports.

FIGS. 7A-7D are plan view illustrations of deflectors with different cross-sectional shapes for the passages, in accordance with some embodiments.

FIG. 7A shows a circular cross-section for the passage.
FIG. 7B shows a hexagonal cross-section for the passage.
FIG. 7C shows a triangular cross-section for the passage.
FIG. 7D shows a rectangular cross-section for the passage.

DETAILED DESCRIPTION

Figure 1:
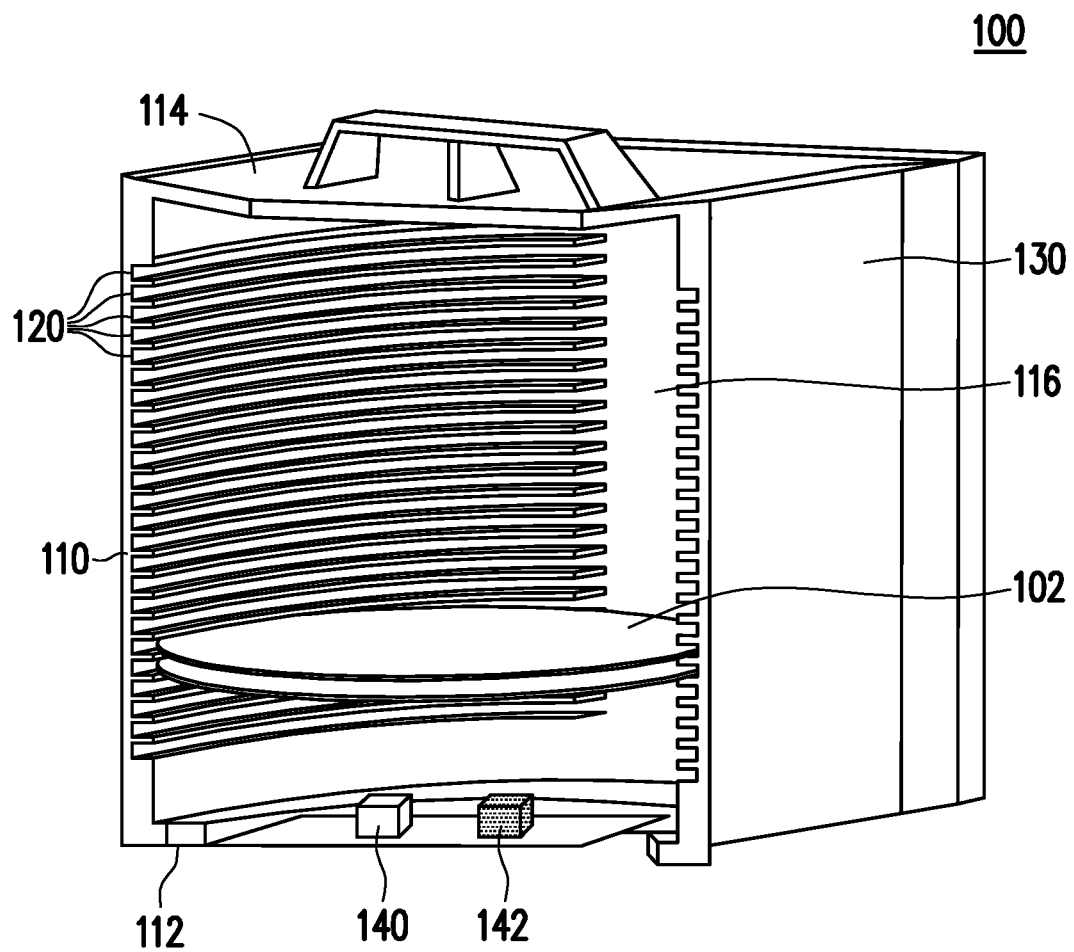
FIG. 1 is a FOUP (Front Opening Unified Pod) used in some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The term "gas" as used herein should be construed as referring to the gaseous state of matter, and is not limited to any particular gas. The term "gas" encompasses, for example, gases having specific properties, such as reactivity or non-reactivity, etc.; ambient air; purified or otherwise modified air; vapors; etc.

The term "perpendicular" is used to refer to an angle of 90°±5°.

The present disclosure refers to "laminar flow" and "turbulent flow". Laminar flow is characterized by fluid particles following smooth paths in layers, with little or no mixing between layers. In turbulent flow, the fluid particles follow chaotic paths and do not flow in layers, and there is a higher degree of mixing.

The present disclosure relates to systems which can reduce the relative humidity within a Front Opening Unified Pod (FOUP) when the FOUP is mounted or loaded onto an Equipment Front End Module (EFEM).

In this regard, a semiconductor wafer substrate is processed at many different workstations or process machines during the manufacture of an integrated circuit. For example, various processing steps including deposition, cleaning, ion implantation, etching and passivation may be carried out during fabrication. To store and/or transport one or more semiconductor wafer substrates between various workstations, a Front Opening Unified Pod (FOUP) is used. The wafer substrates need to be protected from contaminants such as particles, organics, gases, metallics, water and the like, which may adhere to or adversely affect the desired properties of the integrated circuits being built thereon, and a FOUP serves this purpose. In particular, when the FOUP is closed, the internal volume of the FOUP can be purged via a purge inlet and a purge outlet. A clean and inert gas, such as nitrogen or clean dry air, can be pumped into the internal volume of the FOUP. Gentle vacuum is used to purge the internal volume of ambient air and the contaminants contained therein, such as moisture, oxygen, particles, and airborne molecular contaminants.

FIG. 1 illustrates a front opening unified pod (FOUP) 100 in accordance with some embodiments of the present disclosure. The FOUP 100 acts as a storage container and carrier for wafer substrates 102 therein. The FOUP is formed from a sidewall 110 disposed on a base 112 and joined with a lid 114, which together define an interior volume 116 for storing several wafer substrates 102. As seen here, a plurality of slots 120 is formed in the sidewall 110 of the pod 100, and each slot is able to hold a substrate within the interior volume of the pod in a desired position. The pod also includes a front door 130 for accessing the interior volume. The front door may be movable or removable or separable from the sidewall, so as to permit the substrates to be transferred in and out of the FOUP. As illustrated here, the front door is moved to one side of the pod. The dimensions of the FOUP may vary, depending on the size of the substrate that needs to be accommodated. In this regard, photolithographic processes may be performed on wafer substrates having diameters of about 200 mm, or about 300 mm, or about 450 mm, depending on the generation of the tooling being used, and so the dimensions of the FOUP will change as well.

The FOUP 100 also includes a purge inlet 140 and a purge outlet 142, which are illustrated here as being located on the base of the FOUP. When the front door is closed so as to separate the interior volume of the FOUP from the exterior environment, the interior volume can be purged of contaminants. An exterior gas source is attached to the purge inlet, and a vacuum source is attached to the purge outlet.

A cleaning gas, such as nitrogen gas ($N_2$) or clean dry air (CDA), can be introduced into the interior volume 116 of the FOUP to purge contaminants that may be present therein, either in the air or as deposits on the surfaces within the interior volume. The introduction of the cleaning gas, along with gentle suction through the purge outlet, creates a flow path through the interior volume and around any substrates that leads contaminants out of the interior volume. Such contaminants may include chemical residues such as $NH_3$, $SO_4$, F, Cl, $NO_3$, $PO_4$, etc. A clean and secure environment is thus provided for the wafer substrates housed therein.

Figure 2:
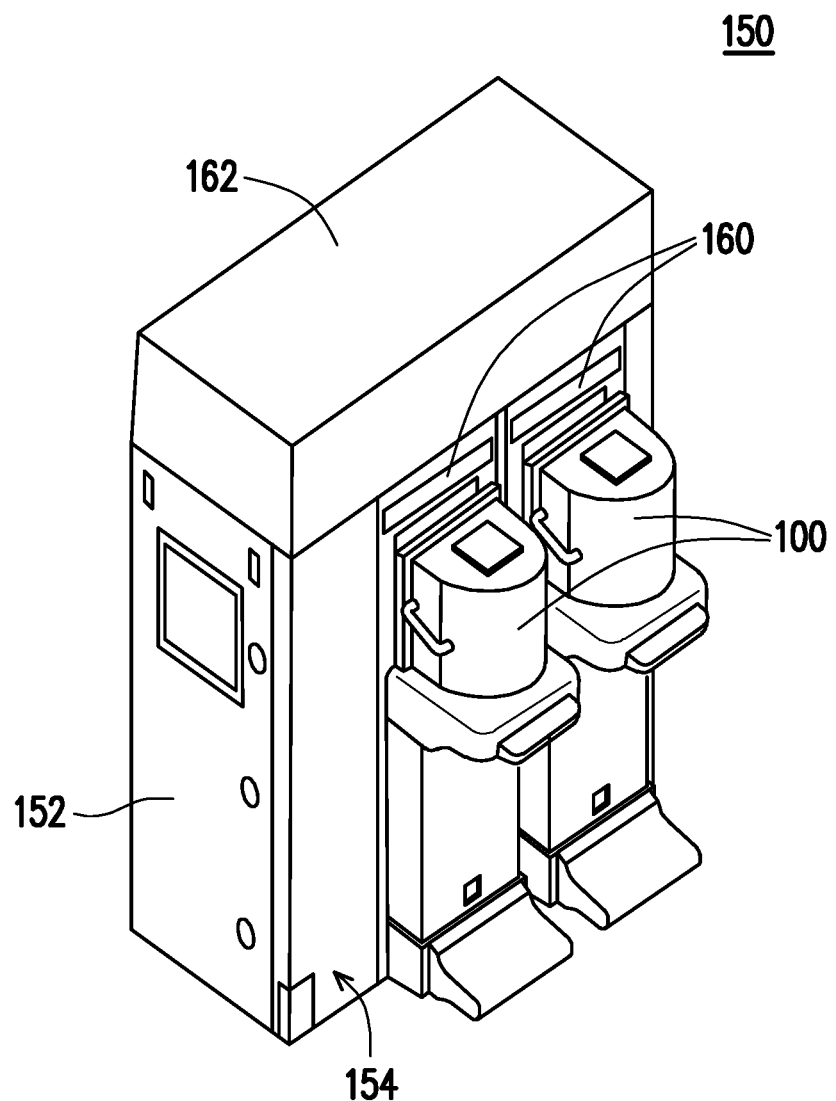
FIG. 2 is a front perspective view of an EFEM (Equipment Front End Module), according with some embodiments of the present disclosure.

However, one particular situation in which the wafer substrates (and the interior volume of the FOUP) become vulnerable to exposure to moisture, oxygen, particles, and other airborne molecular contaminants is when the FOUP is opened at a given processing tool so the semiconductor wafer substrates can be accessed. FIG. 2 is an exterior perspective view of an Equipment Front End Module (EFEM) 150, according to an embodiment of the present disclosure. An EFEM is a structure that is part of an automated material handling system (AMHS) for moving the wafer substrates between a storage carrier (i.e. a FOUP) and a variety of different process modules. The EFEM takes the form of a four-sided housing 152. The front side 154 of the housing includes one or more load ports 160. Two load ports are illustrated here. Each load port 160 is configured in accordance with the FIMS (front-opening interface mechanical standard), to receive a FOUP 100 and access the contents thereof while protecting the contents from contaminants. Opposite the front side of the EFEM, a processing tool (not shown) is typically coupled to the EFEM. The top of the housing includes a filter fan unit (FFU) 162, which is a high quality unit that provides a laminar gas flow to the interior environment of the housing 152, which acts as an active air curtain. The floor of the EFEM is typically perforated, and the downward flow of air blows contaminants out of the interior and out of the EFEM.

In this regard, the downflow gas supplied by the FFU (filter fan unit) 162 typically has a much higher relative humidity compared to the interior environment of the FOUP. For example, the relative humidity of the air within the EFEM is typically about 40% to about 50%. In contrast, the relative humidity of the air within the FOUP is usually less than 1%. As a result, when the FOUP is placed in its open configuration and in fluid communication with the EFEM environment, the FOUP and the wafer substrates within the FOUP are exposed to the high relative humidity of the EFEM. This humidity and exposure to oxygen and moisture can cause problems on the wafer substrate, such as undesirable oxidation of copper on the wafer substrate.

Even if the cleaning/purging process is operated while the front door of the FOUP is open, the pressure provided by the FFU is higher than that of the cleaning process itself. In addition, due to turbulence created by the load port itself, the contaminants in the high-humidity laminar air flow provided by the FFU can also blow into the interior of the FOUP, rather than remaining just near the front door of the FOUP or being blown out the perforated floor of the EFEM. Also, when the front door of the FOUP is again closed. additional time is needed to fully replace the interior volume with inert $N_2$ or clean dry air.

Thus, in the systems and methods of the present disclosure, a deflector is provided within the EFEM housing. The deflector is used to affect the flow pattern of the air in the EFEM, in particular by directing the flow of air away from the load port and the FOUP located therein. A plurality of apertures (or holes) in the body of the deflector act as guides to direct the laminar air flow near the load port away and further into the interior of the EFEM housing, while maintaining the laminarity of the air flow. By diverting the laminar air flow away from the open FOUP, the increase in relative humidity within the FOUP is reduced.

Figure 3:
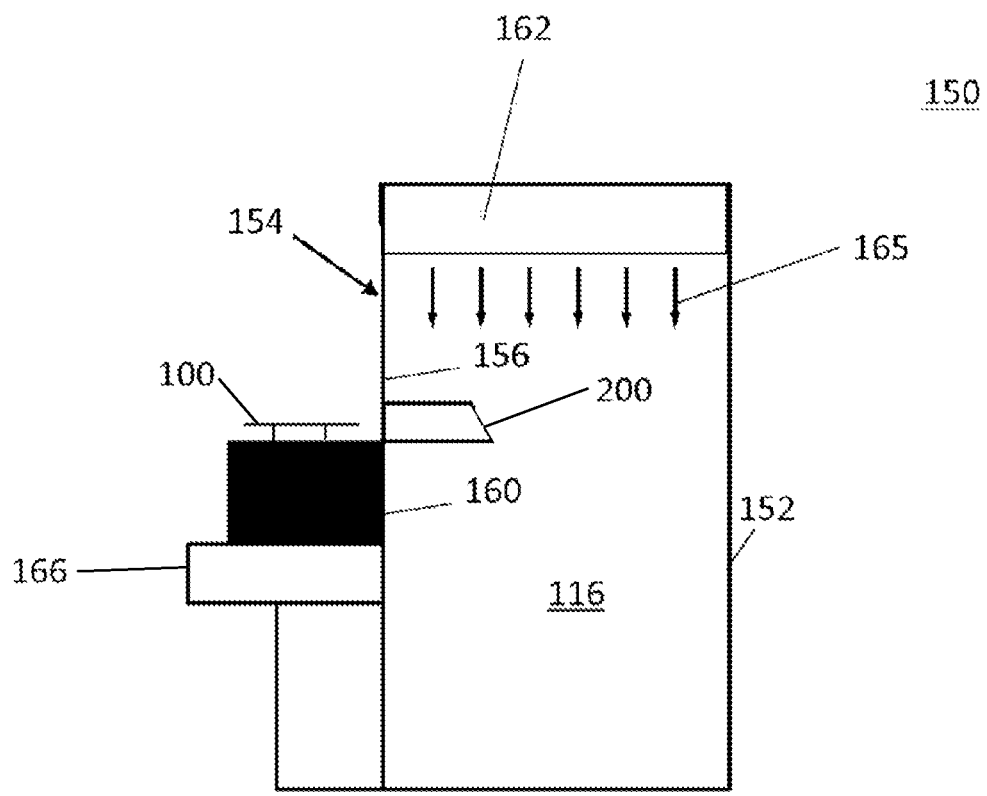
FIG. 3. is a side cross-sectional schematic view of an EFEM, in accordance with some embodiments of the present disclosure.

FIG. 3 is a side cross-sectional schematic view of the EFEM 150, in accordance with some embodiments of the present disclosure. The interior volume 116 of the EFEM housing 152 is in fluid communication with the FFU 162. The FFU typically includes a filter for capturing large particles before a laminar air flow or active air curtain is produced by one or more fans within the FFU The FFU is mounted to the top of the main housing 152, and creates a laminar air flow (arrows 165) that travels in a downward direction throughout the entirety of the interior volume. In some embodiments, the relative humidity of the interior volume/the downward laminar gas flow is from about 40% to about 50%, and in particular embodiments approximately 42%. The flow rate of the laminar air may be, for example, about 0.03 meters per second (m/s) to about 0.5 m/s, or any other appropriate or desired flow rate. The downflow gas is vented into the interior volume 116 through a first perforated plate at the top of the housing, and exhausted through a second perforated plate at the bottom of the housing out of the EFEM and into the ambient environment.

Continuing, the front side 154 of the housing 152 includes at least one load port 160. EFEMs having two or four load ports are known, and generally any number of load ports may be present. As illustrated here, a shelf 166 is also present, upon which the FOUP 100 rests. The front of the FOUP is attached to the load port 160, so that the wafer substrates within the FOUP can be accessed. The load port itself includes a door, and the FOUP also includes its own front door. The load port door is typically opened manually when the FOUP is set in place. The opening of the FOUP door may be controlled by a computer interface or any other automatic process. When the FOUP is opened, the interior of the FOUP 100 is in fluid communication with the interior volume of the EFEM. This means that the semiconductor wafer substrates stored within the FOUP are exposed to the high relative humidity present within the FFU.

Referring still to FIG. 3, a deflector 200 is affixed to an interior surface 156 of the EFEM main housing 152. The deflector is located above the load port 160, and below the FFU. The presence of the deflector operates to direct the laminar air flow away from the load port. The deflector itself does not provide active air.

The deflector can be affixed to the interior surface using any known means. For example, in some embodiments, the deflector may be bonded to the EFEM main housing by welding or by use of an adhesive. As another example, it is contemplated that the EFEM housing may include a plurality of fasteners that engage complementary apertures on the deflector. Alternatively, in another embodiment, the rear surface of the deflector may include at least one flange that engages a corresponding trough in the EFEM main housing, for example by sliding into the trough and being held in place. Such an arrangement may also be reversed, with the rear surface of the deflector including a trough which engages a flange on the EFEM housing.

With respect to location, in some embodiments, the top of the load port/FOUP is typically between about 1 meter to about 5 meters from the bottom of the FFU. In various embodiments, the lower surface of the deflector 200 may be located about 0 to about 20 centimeters (cm) above the top of the load port/FOUP. Outside of this range, the diverted air flow may have sufficient time to be directed back towards the load port/FOUP.

Figure 4:
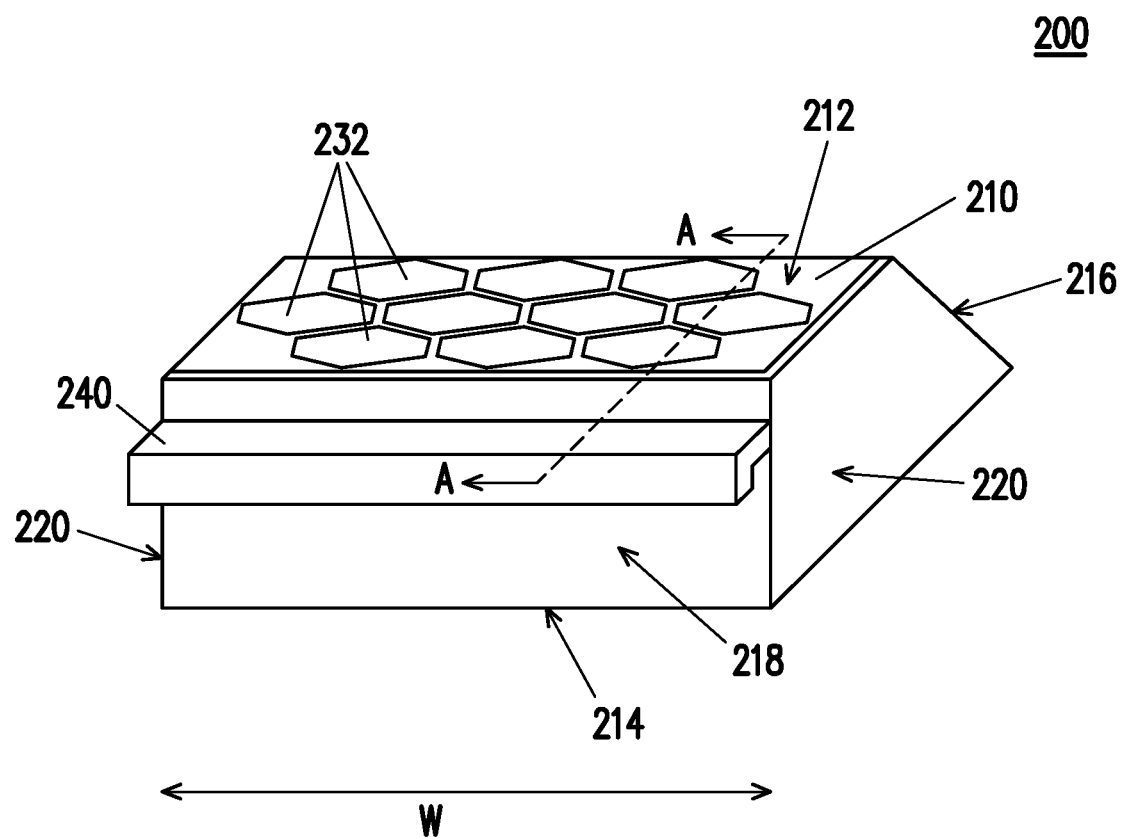
FIG. 4 is a rear perspective view of a first embodiment of a deflector, in accordance with some embodiments of the present disclosure.
Figure 5:
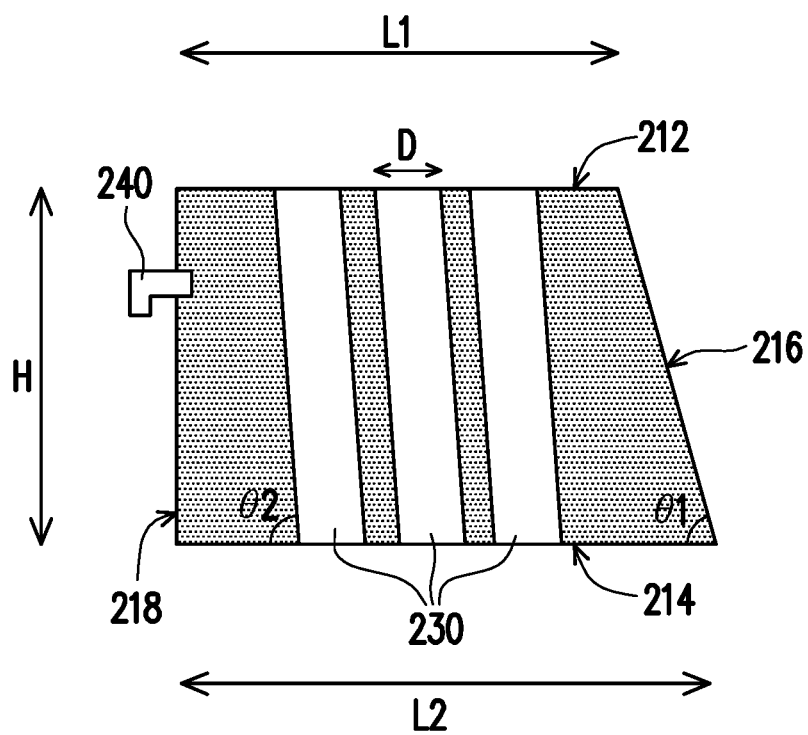
FIG. 5 is a cross-sectional view of the deflector of FIG. 4.

FIG. 4 is a rear perspective view and FIG. 5 is a side cross-sectional view of a deflector 200, in accordance with some embodiments of the present disclosure. The deflector includes a body 210 which has the shape of a trapezoidal prism, having six faces. The upper surface 212 has a shorter length than the lower surface 214. The body also includes a front surface 216 and an opposite rear surface 218, as well as two side faces 220. The front surface 216 is angled relative to the lower surface 214, and is flat or linear.

It is noted that when installed into the EFEM, the rear surface is affixed to the interior surface of the EFEM housing. The upper surface 212 and the lower surface 214 are substantially perpendicular to the laminar air flow within the EFEM.

As best seen in FIG. 5, the body also contains a plurality of passages 230 which run from the upper surface 212 through the entirety of the body to the lower surface 214. The passages may be straight, and extend entirely through the body. The apertures or holes 232 visible in FIG. 4 illustrate the cross-sectional shape of the passages. As illustrated here, the cross-sectional area of each passage 230 has the shape of a hexagon. It is contemplated that all passages will have the same cross-sectional shape within the deflector. For each passage 230, the aperture on the upper surface 214 is proximate the rear surface 218, and the aperture on the lower surface 214 is proximate the front surface 216. Put another way, the passages are angled away from the rear surface. The passages are also organized in a matrix to most efficiently use the volume in the deflector.

Referring again to the cross-sectional view of FIG. 5, a flange 240 is illustrated extending from the rear surface 218 of the body 210. As previously discussed, the flange can be used to attach the deflector to the EFEM housing.

As seen in FIG. 4 and FIG. 5, the deflector has a height H measured between the upper surface 212 and the lower surface 214. The height H of the deflector is generally constant between these two surfaces, and changes in the portion located between the front surface 216 and the lower surface 214. The deflector has a width W measured between the two side faces 220. The width W is generally constant when measured anywhere between the rear surface 218 and the front surface 216. The upper surface 212 has a length L1, and the lower surface 214 has a length L2.

In particular embodiments, the height H of the deflector is from about 2 centimeters (cm) to about 15 cm. If the height is too short, then the passages will be unable to move the laminar air flow close to the load port a sufficient distance away from the load port while maintaining the laminarity of the air flow. When the height is too tall, it is noted that while the upper surface of the deflector contains apertures, the laminar air flow will still runs into the remaining surface and create turbulent flow. Laminar flow is desired rather than turbulent flow.

In particular embodiments, the length L2 of the lower surface 214 is also from about 2 centimeters (cm) to about 15 cm. If the length is too short, then the passages will be unable to move the laminar air flow close to the load port a sufficient distance away from the load port while maintaining the laminarity of the air flow. A length of about 15 cm is sufficient for moving the laminar air flow away from the load port, and any additional movement beyond the distance of about 15 cm is not needed.

In particular embodiments, the length L1 of the upper surface 212 is less than length L2. As a result, the laminar air flow is moved away from the load port and creation of turbulent flow is avoided.

Referring now to FIG. 5, two angles θ1 and θ2 are indicated. The first angle θ1 indicates the angle between the lower surface 214 and the front surface 216. In particular embodiments, first angle θ1 is from about 60° to 90°.

The second angle θ2 indicates the angle of the passages within the body, and is measured relative to the lower surface 214. In particular embodiments, second angle θ2 is also from about 60° to 90°. Generally, the second angle θ2 is greater than the first angle θ1. It is noted that the passages 230 within the deflector are all parallel to each other. The parallel apertures thus maintain the laminar air flow in the interior volume of the EFEM housing directing the intercepted air flow away from the load port by the same distance. When θ1 and θ2 are less than about 60°, the air flow becomes more turbulent and less laminar.

Continuing, the passages have a diameter D. In particular embodiments, the diameter D is from about 5 millimeters (mm) to about 15 mm, in order to fit within the dimensions of the deflector body. Generally, all of the passages should have the same diameter, though this is not required.

Figure 6A:
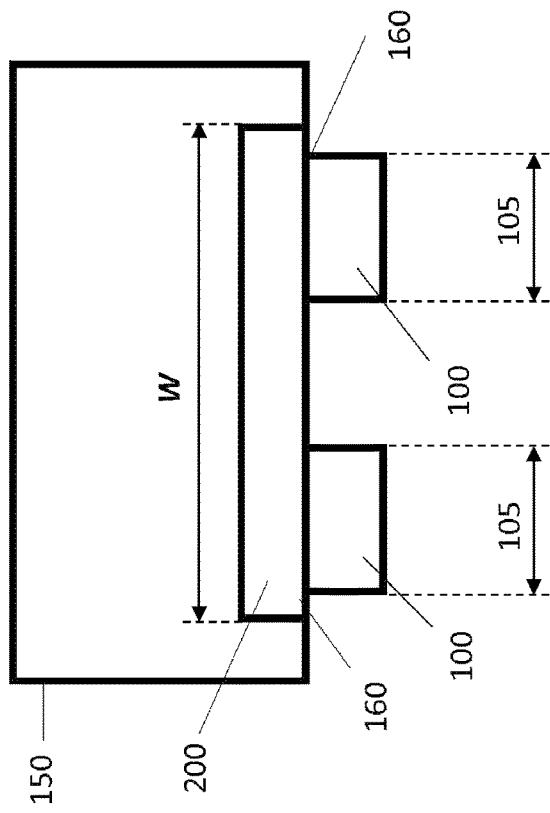
FIGS. 6A-6B are illustrations of different configurations of deflectors with load ports, in accordance with some embodiments.
Figure 6B:
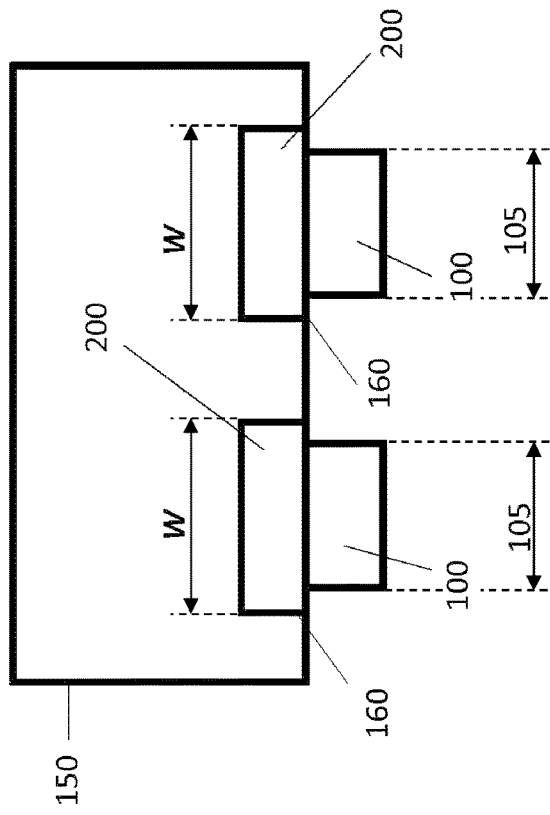

FIG. 6A and FIG. 6B are plan cross-sectional views of two different embodiments of a system comprising an Equipment Front End Module (EFEM) and a deflector. In both figures, the EFEM 150 has two load ports 160. Two FOUPs 100 are illustrated adjacent to the load ports. In both figures, the width of the load port is identified with reference numeral 105. The width of the deflector is indicated with the letter W.

In this regard, the dimensions of the load port (and the FOUP) will vary depending on the dimensions of the wafer substrates contained therein. For example, a FOUP for 300 mm semiconductor wafers has standard dimensions of approximately 420 mm width by 300 mm length by 300 mm height. Generally, the deflector is large enough to divert air flow across the entire width of at least one load port, and potentially more.

In the embodiment illustrated in FIG. 6A, each load port 160 has its own deflector 200, or more generally the number of load ports is equal to the number of deflectors in the EFEM housing. In such embodiments, the width W of the deflector may be from about 100% to about 120% of the width 105 of the load port. For example, if the width of the load port was 420 mm, then the deflector 120 would have a width of about 420 mm to about 504 mm.

In the embodiment illustrated in FIG. 6B, one deflector 200 is present, which has a width W sufficient to span the width of both load ports 160 as well as the intervening distance between the two load ports. More generally, the deflector may have a width W that is at least as great as the cumulative widths of the load ports in the EFEM housing.

The cross-sectional shape of the passages 230 within the deflector is not significant, and the passages may generally have any cross-sectional shape. For example, FIGS. 7A-7D illustrate different cross-sectional shapes for the passages and layouts on the upper surface 212. In these figures, the sloped front surface 216 is also visible. FIG. 7A illustrates a deflector where the passages have a circular shape. In FIG. 7B, each passage has a hexagonal shape. FIG. 7C illustrates passages with a triangular shape. FIG. 7D illustrates passages having a rectangular shape.

Referring now to FIG. 7A, each passage 230 has a diameter 235. As previously mentioned, in particular embodiments, the diameter of the passage is from about 5 millimeters to about 15 millimeters, in order to fit within the dimensions of the deflector body. For passages that do not have a circular cross-section, the diameter can be calculated as the equivalent diameter of a circle that has the same cross-sectional area of the non-circular passage. If the diameter is below 5 mm, the flow resistance becomes too high, and turbulent flow may result around the deflector. If the diameter is above 15 mm, the resulting air flow exiting the deflector will not be laminar.

The deflector can be made as desired from conventional materials, such as plastics and/or metals. The shape and size of the deflector can be varied using conventional manufacturing techniques.

Figure 8:
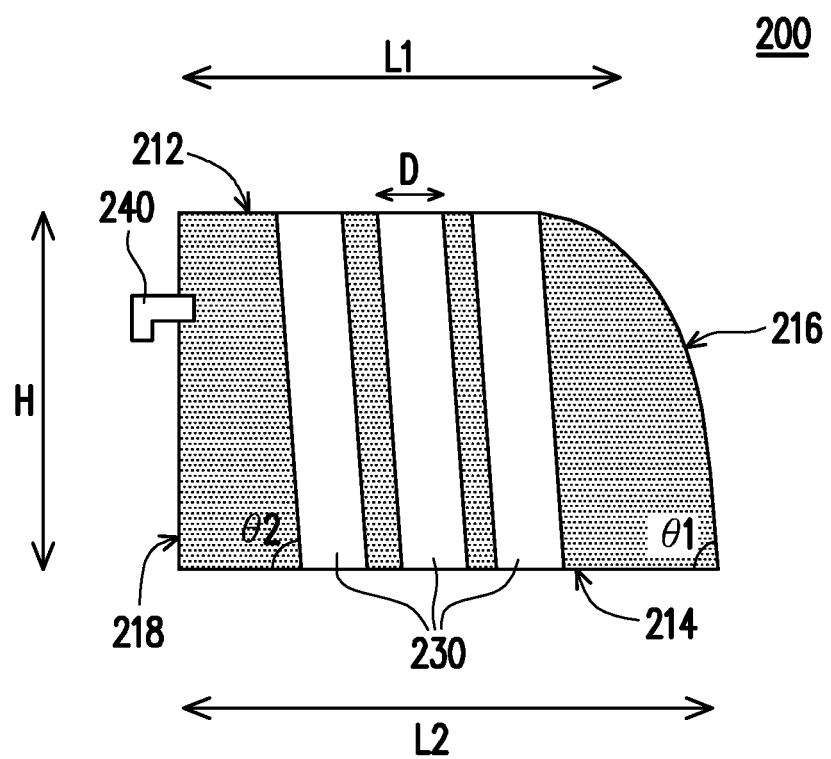
FIG. 8 is a side cross-sectional view of a second embodiment of a deflector of the present disclosure.

FIG. 8 is a side cross-sectional view of a second embodiment of a deflector 200, according to further embodiments of the present disclosure. The main difference in this embodiment is that the front surface 216 is arcuate or curved, rather than a flat surface as in the embodiment of FIG. 5. The curved front surface still maintains laminar air flow. Otherwise, the various dimensions and relationships between the various parts of the deflector are the same.

Figure 9:
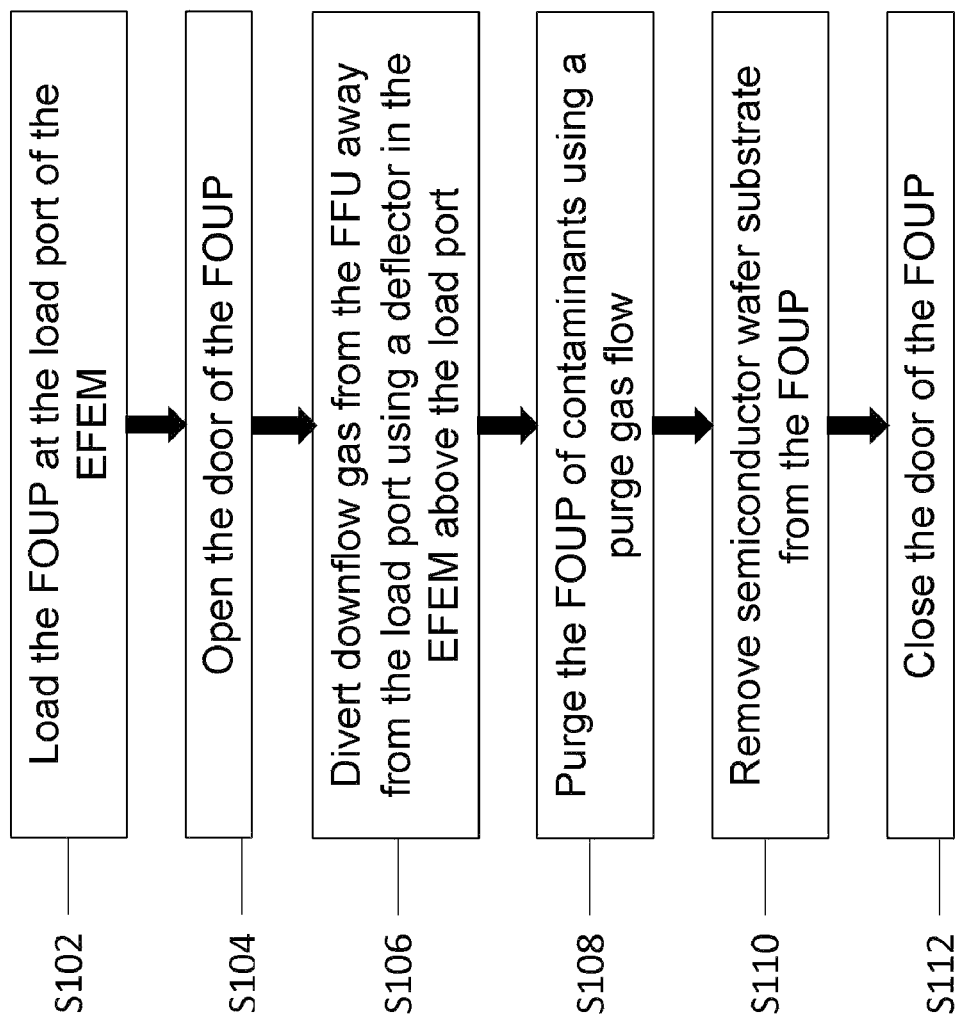
FIG. 9 is a flow chart depicting a method of using the deflector to reduce the relative humidity in a FOUP during use, according to some embodiments of the present disclosure.

FIG. 9 is a flow chart illustrating a method of using the systems and deflectors described herein to reduce the relative humidity in a FOUP during the transfer of a semiconductor wafer substrate, according to an embodiment of the present disclosure. The method may also be better understood by referring to FIG. 3. The system includes a FOUP 100, an EFEM 150, and a deflector 200 within the EFEM housing 152.

First, in step S102, the FOUP 100 is loaded at a load port 160 of the EFEM. As part of this step, the load port door of the EFEM is also opened.

In step S104, the door of the FOUP is opened, exposing the wafer substrates within to the interior volume of the EFEM housing. The wafer substrates can be, for example, wafers made of silicon, germanium arsenide (GaAs), or gallium nitride (GaN), or some other suitable material. In particular embodiments, the methods described in the present disclosure use silicon wafers as the wafer substrate.

Next, in step S106, the downflow gas 165 generated by the FFU 162 is diverted away from the load port 160 using the deflector 200, which is located on an interior surface of the EFEM above the load port. The downward laminar gas flow enters the apertures/passages and is directed a short distance away from the open front of the FOUP. The distance by which the laminar air flow is diverted is determined by the angle of the passages within the deflector 200. As a result, the higher-humidity air of the FFU does not enter the FOUP.

In step S108, the FOUP is purged of contaminants using a purge gas flow. The purge gas is an inert gas such as $N_2$ or can be clean dry air. This step typically requires the FOUP to be connected to a purge gas source.

It is noted that the relative humidity of the FOUP is typically maintained at less than 1% when closed. As a result of this method, the relative humidity of the FOUP can remain at less than 25% when the door is open and during purging. Low relative humidity within the FOUP is the desired outcome. In particular embodiments, the relative humidity of the FOUP can remain at less than 20%, or less than 15%, or less than 10%.

In additional embodiments of the method, in step S110, a semiconductor wafer substrate is removed from the FOUP, for transferring to a process module. In step S112, the door of the FOUP is then closed. It is noted that step S108, purging the interior volume of the FOUP, can be performed continuously during steps S104, S106, S110, and S112, or can alternatively be performed after step S112.

Figure 10:
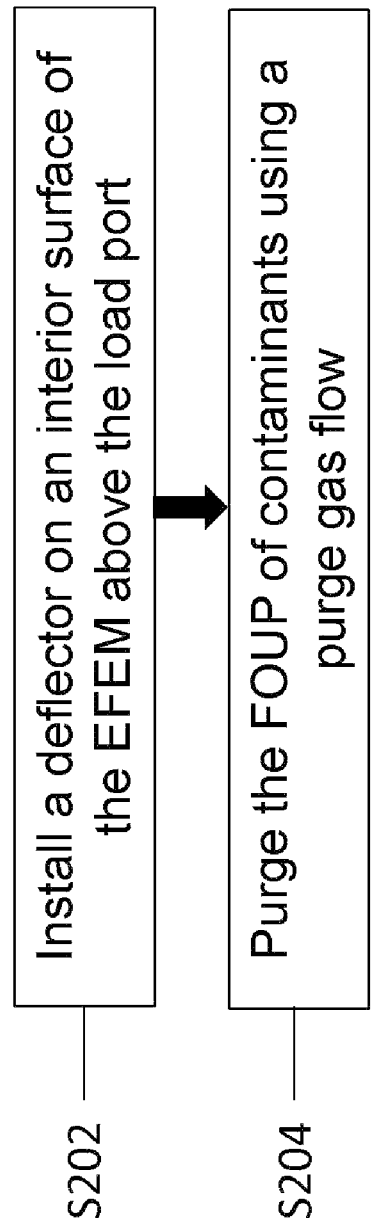
FIG. 10 is a flow chart depicting a method for reducing airflow from an EFEM into a FOUP using a deflector, according to some embodiments of the present disclosure

FIG. 10 is a flow chart illustrating a method of using the systems and deflectors described herein to reduce airflow from an EFEM into a FOUP, according to an embodiment of the present disclosure. Again, the method is described with concurrent reference to FIG. 3. The system includes a FOUP 100, an EFEM 150, and a deflector 200 within the EFEM housing 152.

Very generally, in step S202, a deflector 200 is installed on an interior surface 156 of the EFEM above the load port 160 of the EFEM. The deflector is oriented to direct laminar air flow away from the load port. As a result, when the FOUP is opened, the amount of airflow provided by the FFU which flows into the FOUP is reduced, compared to an EFEM that does not use such a deflector.

If desired, in additional step S204, the FOUP is purged with a purge gas flow when attached to the EFEM. This is similar to step S108 of FIG. 9. This also reduces airflow from the EFEM into the FOUP.

Figure 11:
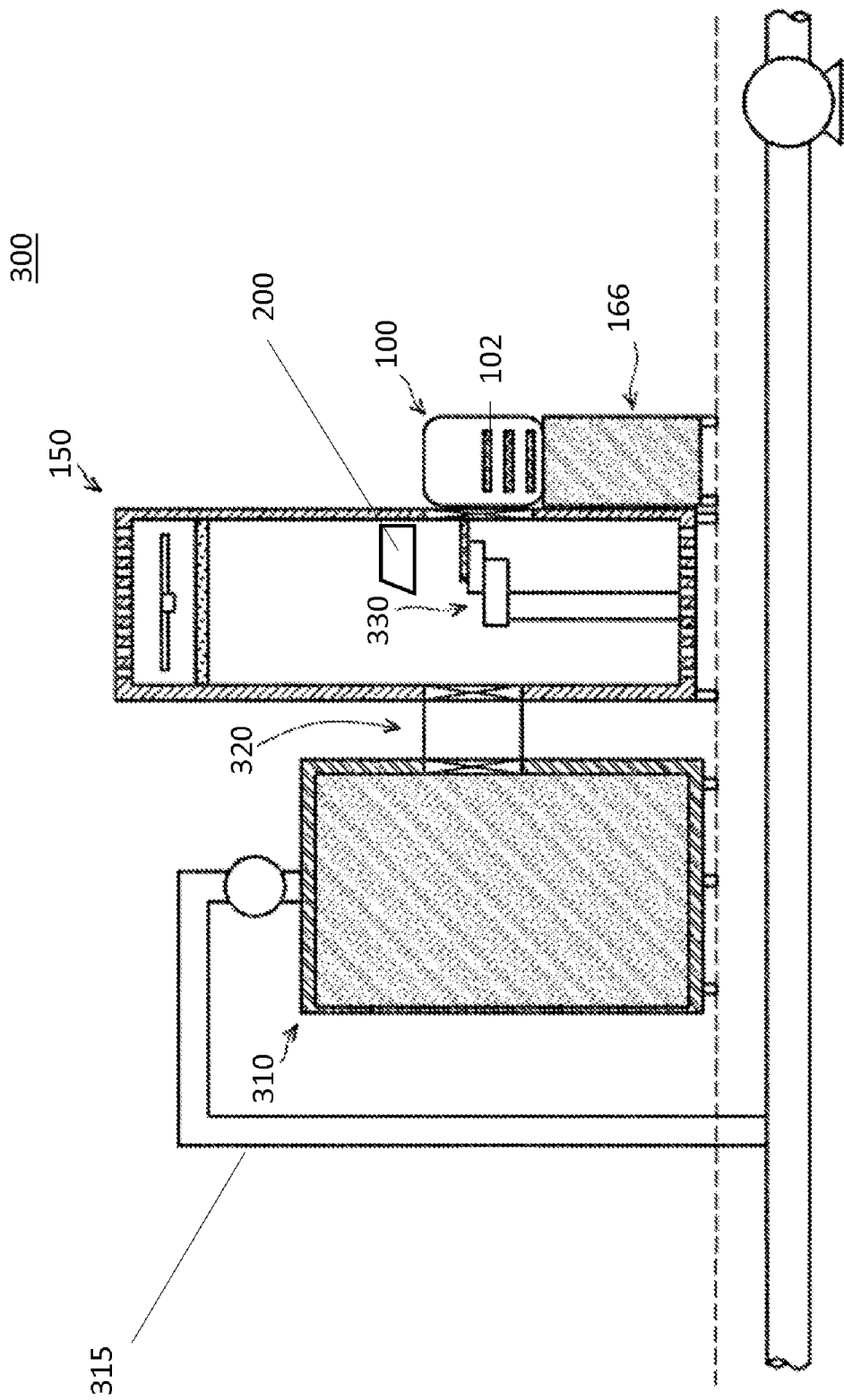
FIG. 11 depicts a schematic view of a wafer processing system, in accordance with some embodiments of the present disclosure.

Referring now to FIG. 11, a processing system 300 is illustrated. Broadly, the processing system as illustrated includes EFEM 150 and process module 310. A load lock module 320 is located between the EFEM 150 and the process module 310.

As illustrated here, a FOUP 100 is also present, sitting on a shelf 166 before the load port of the EFEM. Wafer substrates 102 are present within the FOUP. A deflector 200 is also present within the EFEM, above the load port and the FOUP.

The EFEM also contains a wafer transfer module 330 for the load port.

Generally, radial, axial, and rotational movements of the wafer transfer module 330 can be coordinated or combined in order to pick up, transfer, and deliver the wafer substrate 102 between different locations within the processing system 300. For example, as illustrated here, the wafer transfer module 330 can be used to transfer a wafer substrate 102 between the FOUP 100 and the load lock module 320.

The load lock module 320 may be configured to preserve the atmosphere within the process module 310, for example if the atmosphere is a high vacuum atmosphere or contains reactant gases for a processing step. A separate ventilation system 315 for the process module 310 is illustrated here. After the wafer substrate 102 is inserted into one end of the load lock module 320, a door on that end of the load lock module is sealed. The smaller volume of the load lock module is then changed to match the atmosphere within the process module 310. The wafer substrate within the load lock module can then be accessed by automated equipment within the process module.

The process module 310 is generally configured to perform manufacturing procedures involved in the processing of one or more than one wafer substrate. In some particular embodiments, the wafer substrate is a multi-layered substrate containing circuits made from a combination of semiconducting layers, electrically conductive layers, and/or electrically insulating layers. Some examples of processes that include multiple substrates include the combination of a wafer substrate with an insulating substrate, such as that used to produce a silicon-on-insulator (SOI) wafer, a silicon-on-sapphire wafer, or a silicon-germanium-on-insulator wafer.

In some embodiments, the process module 300 may be configured to perform any manufacturing procedure or combination of procedures on the wafer 102. Such manufacturing processes may include a deposition process, an etching process, a photolithographic exposure process, an ion implantation process, a thermal process, a cleaning process, or a testing process.

Non-limiting examples of deposition processes include physical vapor deposition (PVD), chemical vapor deposition (CVD), plasma enhanced chemical vapor deposition (PECVD), sub-atmospheric chemical vapor deposition (SACVD), and sputtering. Very generally, in a deposition process one or more atoms are deposited upon the wafer substrate to form a thin film with desired properties. Non-limiting examples of etching processes include wet etching, dry etching, and ion beam milling. Generally, etching processes remove material from the wafer substrate in selected locations. In a photolithographic exposure process, multiple steps occur. Photoresist is deposited upon the wafer substrate, and usually spin dried to form a uniform layer. A reticle/photomask that includes a desired mask pattern is exposed to light, either by reflection or transmission, to transfer the pattern to the photoresist layer. The exposed portion of the photoresist is photochemically modified. The resist is developed to define openings in the resist and expose the layer(s) beneath the photoresist. Any or all of these steps may be performed in the process module. In an ion implantation process, an ion implanter is used to implantation various atoms into a silicon crystal lattice, which modifies the conductivity of the lattice in the implanted location to act as a component of a transistor. In a thermal process, the wafer substrate is exposed to high temperatures, for example for annealing a particular layer. A cleaning process removes contaminants or undesired material from the surface of the substrate. Examples of cleaning processes may include a multi-step RCA clean using $H_2SO_4/H_2O_2$, peroxide, HF acid, $HCl/H_2O_2$, and rinsing with deionized water; degreasing; and plasma treatment. Testing processes include measurement of various widths, diameters, and thicknesses, as well as inspection for compliance with specifications and detection of particles or defects on the wafer substrate.

Figure 12:
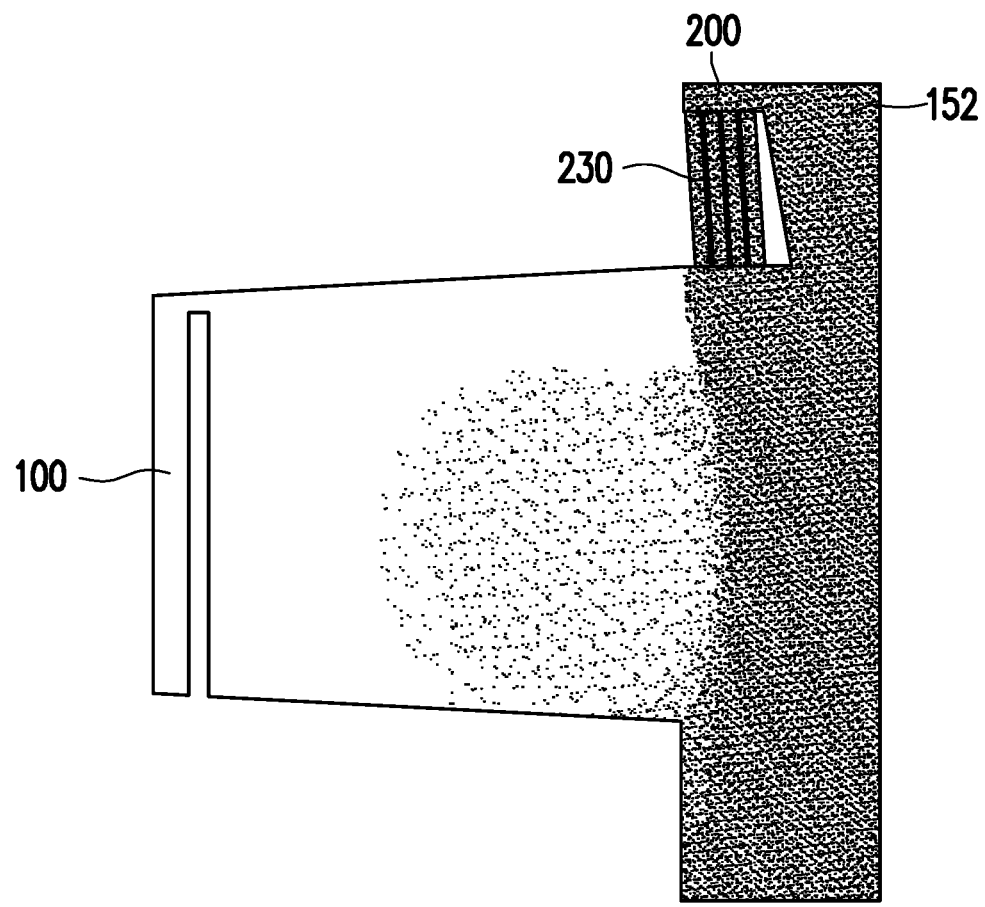
FIG. 12 is a humidity heat map of an EFEM with a deflector and a FOUP, in accordance with some embodiments of the present disclosure.

FIG. 12 is a humidity heat map generated in a simulator. The heat map includes a FOUP 100 in fluid communication with the EFEM interior volume of the EFEM housing 152. Deflector 200 is disposed directly above the top surface of the FOUP. The plurality of passages 230 through the deflector is also visible. High humidity is indicated in white, and low humidity is indicated in black. As seen in the heat map, the high humidity air within the EFEM housing is directed away from the FOUP by the apertures. This allows the FOUP to maintain relatively low humidity in its interior. In some embodiments, the relative humidity in the FOUP 106 is about 25% or less.

Some embodiments of the present disclosure thus relate to a processing system in which a semiconductor wafer substrate is transferred to a process module. The system comprises an equipment front end module (EFEM) and a process module. The EFEM has at least one load port in a side thereof and a fan filter unit (FFU) in a top thereof that creates downward laminar air flow within the EFEM. At least one deflector is located on an interior surface of the EFEM above the at least one load port. The at least one deflector directs the laminar air flow away from the at least one load port. The deflector comprises a body having a sloped or curved front surface, a rear surface abutting the interior surface of the EFEM, and a plurality of parallel passages running from an upper surface of the body to a lower surface of the body which are angled away from the upper surface. The process module is configured to receive a semiconductor wafer substrate from the EFEM when a Front Opening Unified Pod (FOUP) containing the semiconductor wafer substrate is loaded at the at least one load port.

Other embodiments of the present disclosure relate to methods for reducing relative humidity in a Front Opening Unified Pod (FOUP) during transfer of a semiconductor wafer substrate. The FOUP is loaded at a load port of an equipment front end module (EFEM). The door of the FOUP is opened. Downflow gas generated by a fan filter unit (FFU) is diverted away from the load port using a deflector located on an interior surface of the EFEM above the load port. The deflector comprises a body having a sloped or curved front surface, a rear surface abutting the interior surface of the EFEM, and a plurality of parallel passages running from an upper surface of the body to a lower surface of the body which are angled away from the upper surface. In addition, the interior of the FOUP is purged with a purge gas flow.

Also disclosed in various embodiments are methods for reducing airflow from an equipment front end module (EFEM) into a Front Opening Unified Pod (FOUP) during transfer of a semiconductor wafer substrate. To do so, a deflector is installed on an interior surface of the EFEM above a load port of the EFEM, so that the deflector directs laminar air flow away from the load port. The deflector comprises a body having a sloped or curved front surface, a rear surface abutting the interior surface of the EFEM, and a plurality of parallel passages running from an upper surface of the body to a lower surface of the body which are angled away from the upper surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for transferring a semiconductor wafer substrate to a process module, comprising:
    an equipment front end module (EFEM) having at least one load port in a side thereof and a fan filter unit (FFU) in a top thereof that creates downward laminar air flow within the EFEM;
    at least one deflector located on an interior surface of the EFEM above the at least one load port and below the FFU for directing laminar air flow away from the at least one load port, comprising a body having a sloped or curved front surface, a rear surface abutting the interior surface of the EFEM, a plurality of parallel passages running from an upper surface of the body to a lower surface of the body which are angled away from the rear surface, and a flange extending from the rear surface of the body that engages a trough in the EFEM; and
    a process module configured to receive the semiconductor wafer substrate from the EFEM when a Front Opening Unified Pod (FOUP) containing the semiconductor wafer substrate is loaded at the at least one load port.

2. The system of claim 1, wherein a width of the body is from about 100% to about 120% of a width of the at least one load port.

3. The system of claim 1, wherein the EFEM has a plurality of load ports, and the at least one deflector has a width sufficient to span both the plurality of load ports.

4. The system of claim 1, wherein a diameter of the passages is from about 5 mm to about 15 mm.

5. The system of claim 1, wherein the passages are angled between about 60° to about 90° relative to the lower surface.

6. The system of claim 1, wherein the passages have a cross-sectional area in the shape of a triangle, rectangle, hexagon, or circle.

7. The system of claim 1, wherein the upper surface and the lower surface of the body are substantially perpendicular to the laminar air flow within the EFEM.

8. The system of claim 1, where the at least one deflector is located between 0 to 20 cm above the at least one load port.

9. The system of claim 1, wherein the at least one deflector is positioned from about 1 meter to about 5 meters from the bottom of the FFU.

10. The system of claim 1, wherein the number of deflectors is equal to the number of load ports.

11. The system of claim 1, wherein the laminar air flow in the EFEM has a relative humidity of about 40% to about 50%.

12. The system of claim 1, wherein the process module is configured to perform a deposition process, an etching process, a photolithographic exposure process, an ion implantation process, a thermal process, a cleaning process, or a testing process.

13. A method for reducing relative humidity in a Front Opening Unified Pod (FOUP) during transfer of a semiconductor wafer substrate, comprising,
    loading the FOUP at a load port of an equipment front end module (EFEM);
    opening a door of the FOUP;
    diverting downflow gas generated by a fan filter unit (FFU) away from the load port using a deflector located on an interior surface of the EFEM above the load port, wherein the deflector comprises a solid body having a sloped or curved front surface, an upper surface, a lower surface, a rear surface abutting the interior surface of the EFEM, and a plurality of parallel passages running through the solid body from the upper surface to the lower surface which are angled away from the rear surface; and
    purging the FOUP with a purge gas flow.

14. The method of claim 13, wherein the downflow gas has a relative humidity of about 40% to about 50%, the FOUP has a relative humidity of less than 1% prior to opening the door, and the FOUP maintains a relative humidity of less than 25% during purging.

15. The method of claim 13, wherein the front surface and the passages are each angled relative to the lower surface, and a second angle between the passages and the lower surface is greater than a first angle between the lower surface and the front surface is.

16. The method of claim 13, further comprising:
    removing a semiconductor wafer substrate from the FOUP; and
    closing the door of the FOUP.

17. A method for reducing airflow from an equipment front end module (EFEM) into a Front Opening Unified Pod (FOUP) during transfer of a semiconductor wafer substrate, comprising:
    installing a deflector on an interior surface of the EFEM above a load port of the EFEM, wherein the deflector directs laminar air flow away from the load port;
    wherein the deflector comprises a solid body having a sloped or curved front surface, a rear surface abutting the interior surface of the EFEM, and a plurality of parallel passages running through the solid body from an upper surface of the body to a lower surface of the body which are angled away from the rear surface.

18. The method of claim 17, further comprising purging the FOUP with a purge gas flow.

19. The method of claim 17, wherein a width of the deflector is from about 100% to about 120% of a width of the load port.

20. The method of claim 13, wherein the upper surface and the lower surface of the body are substantially perpendicular to the laminar air flow within the EFEM.

\* \* \* \* \*